United States Patent
Hersee

(10) Patent No.: US 8,964,020 B2
(45) Date of Patent: Feb. 24, 2015

(54) SOLID-STATE MICROSCOPE FOR SELECTIVELY IMAGING A SAMPLE

(75) Inventor: Stephen D. Hersee, Albuquerque, NM (US)

(73) Assignee: STC.UNM, Albuquerque, NM (US)

(*) Notice: Subject to any disclaimer, the term of this patent is extended or adjusted under 35 U.S.C. 154(b) by 1156 days.

(21) Appl. No.: 12/103,920

(22) Filed: Apr. 16, 2008

(65) Prior Publication Data

US 2010/0033561 A1 Feb. 11, 2010

Related U.S. Application Data

(60) Provisional application No. 60/913,927, filed on Apr. 25, 2007, provisional application No. 60/973,465, filed on Sep. 19, 2007.

(51) Int. Cl.

| | |
|---|---|
| *H04N 9/47* | (2006.01) |
| *H04N 5/243* | (2006.01) |
| *H04N 7/18* | (2006.01) |
| *G02B 21/00* | (2006.01) |
| *B82Y 15/00* | (2011.01) |
| *B82Y 20/00* | (2011.01) |
| *H01L 27/15* | (2006.01) |

(52) U.S. Cl.
CPC .............. *G02B 21/002* (2013.01); *B82Y 15/00* (2013.01); *B82Y 20/00* (2013.01); *G02B 21/00* (2013.01); *H01L 27/156* (2013.01)
USPC .............................................. 348/80; 348/79

(58) Field of Classification Search
CPC ...... G02B 21/002; G02B 21/00; B82Y 15/00; B82Y 20/00; H01L 27/156
USPC ...................................................... 348/79, 80
See application file for complete search history.

(56) References Cited

U.S. PATENT DOCUMENTS

| | | | | |
|---|---|---|---|---|
| 7,508,505 | B2 * | 3/2009 | Lustenberger et al. | 356/317 |
| 2005/0047172 | A1 * | 3/2005 | Sander | 362/554 |
| 2005/0271548 | A1 | 12/2005 | Yang et al. | |
| 2006/0082297 | A1 * | 4/2006 | Camp | 313/512 |
| 2006/0284303 | A1 * | 12/2006 | Tokida | 257/697 |

(Continued)

OTHER PUBLICATIONS

J.J. Pan et al., "Adaptive semiconductor-laser phased-arrays for real-time multiple access communications," SPIE vol. 1476 Optical Technology for Microwave Applications V, 1991, pp. 157-169.

(Continued)

*Primary Examiner* — Haresh N Patel
(74) *Attorney, Agent, or Firm* — MH2 Technology Law Group, LLP

(57) ABSTRACT

Exemplary embodiments provide solid-state microscope (SSM) devices and methods for processing and using the SSM devices. The solid-state microscope devices can include a light emitter array having a plurality of light emitters with each light emitter individually addressable. During operation, each light emitter can be biased in one of three operating states including an emit state, a detect state, and an off state. The light emitter can include an LED (light emitting diode) including, but not limited to, a nanowire based LED or a planar LED to provide various desired image resolutions for the SSM devices. In an exemplary embodiment, for near-field microscopy, the resolution of the SSM microscope can be essentially defined by the pitch p, i.e., center-to-center spacing between two adjacent light emitters, of the light emitter array.

14 Claims, 4 Drawing Sheets

(56) References Cited

U.S. PATENT DOCUMENTS

| | | | |
|---|---|---|---|
| 2007/0052660 A1* | 3/2007 | Montbach et al. | 345/102 |
| 2007/0207061 A1 | 9/2007 | Yang et al. | |
| 2007/0211460 A1* | 9/2007 | Ravkin | 362/231 |
| 2008/0036038 A1 | 2/2008 | Hersee et al. | |
| 2008/0271777 A1* | 11/2008 | Stoner et al. | 136/252 |
| 2009/0114900 A1* | 5/2009 | Udagawa | 257/13 |
| 2009/0309135 A1* | 12/2009 | Udagawa | 257/201 |
| 2010/0207040 A1* | 8/2010 | Tanaka et al. | 250/492.2 |

OTHER PUBLICATIONS

Hersee et. al, "MOVPE Growth of GaN Nanowires and their Electrical, Optical and LED Characteristics," SDH: ICMOVPE, Jun. 2008, pp. 1-39.

J. Banerji et al., "Phased array 1-to-N-way resonator with a convex mirror for phase conjugation," Applied Optics, vol. 44, No. 16, Jun. 1, 2005, pp. 3364-3369.

E. Kapon et al., "Longitudinal mode control in integrated semiconductor laser phased arrays by phase velocity matching," Applied Physics Letters, vol. 44, No. 2, Jan. 15, 1984, pp. 157-159.

\* cited by examiner

SOLID-STATE MICROSCOPE FOR SELECTIVELY IMAGING A SAMPLE

RELATED APPLICATIONS

This application claims priority from U.S. Provisional Patent Application Ser. No. 60/913,927, filed Apr. 25, 2007, and Ser. No. 60/973,465, filed Sep. 19, 2007, which are hereby incorporated by reference in their entirety.

GOVERNMENT RIGHTS

This invention was made with government support under Contract No. HR0011-05-1-0006 awarded by Defense Advanced Research Projects Agency (DARPA). The government has certain rights in the invention.

FIELD OF THE INVENTION

This invention relates generally to solid-state microscope devices and, more particularly, relates to lens-less semiconductor-based solid-state microscope devices and methods for their fabrication.

BACKGROUND OF THE INVENTION

A conventional optical microscope uses optical lenses to gather light from an illuminated object and provide a magnified image of that object to the viewer. An additional light source, that itself may require conditioning optics, is often used to illuminate the sample for the conventional optical microscopes.

Such conventional optical microscopes, however, may have drawbacks and disadvantages for specific microscopic applications. For example, when conventional optical microscopes are used to observe biological samples, the strong illumination power of the conventional optical microscopes may irreversibly degrade biological samples, e.g., living cells. This is known as photo-toxicity in the prior art. In addition, it is desirable for modern microscopes to be small, light weight, and free of moving parts, which conventional optical microscopes are not.

Thus, there is a need to overcome these and other problems of the prior art and to provide a compact, portable and robust lens-less microscope that has a high image resolution and a controllable illumination power.

SUMMARY OF THE INVENTION

According to various embodiments, the present teachings include a solid-state microscope (SSM). The SSM can include a semiconductor substrate and a plurality of light emitters disposed on the semiconductor substrate. The plurality of light emitters can be disposed in an array having a pitch p and each light emitter of the plurality of light emitters can be biased in one of an emit operating state, a detect operating state, and an off operating state.

According to various embodiments, the present teachings also include a method for producing a magnified image of an object. In this method, a light emitting diode (LED) array can be formed including a pitch p that corresponds to an image resolution. For producing the magnified image, a first image pixel can be formed by switching on a first LED of the LED array to illuminate a first portion of the object, and using a first plurality of LEDs surrounding the first LED to collect a reflected light from the illuminated first portion of the object. A second image pixel can then be formed by switching off the first LED and switching on a second LED of the LED array to illuminate a second portion of the object, and using a second plurality of LEDs surrounding the second LED to collect a reflected light from the illuminated second portion of the object.

According to various embodiments, the present teachings further include a method for making a solid-state microscope. In this method, a GaN-based LED epitaxial layered structure can be provided including a multi-quantum well active region formed between an n-doped layer and a p-doped layer. The GaN-based LED epitaxial layered structure can be etched to the n-doped layer and whereby forming a plurality of LED mesa structures interspersed with one or more recessed spaces. On the surface of each recessed space and each mesa structure, a passivation layer can be deposited. An n-side metal contact can then be formed in the recessed space to connect with the n-doped layer through the passivation layer, followed by completely filling the recessed space with a dielectric material. P-side metal contacts can be formed on the p-doped layer of each LED mesa structure and further electrically connected with ROIC circuit cells.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1A:
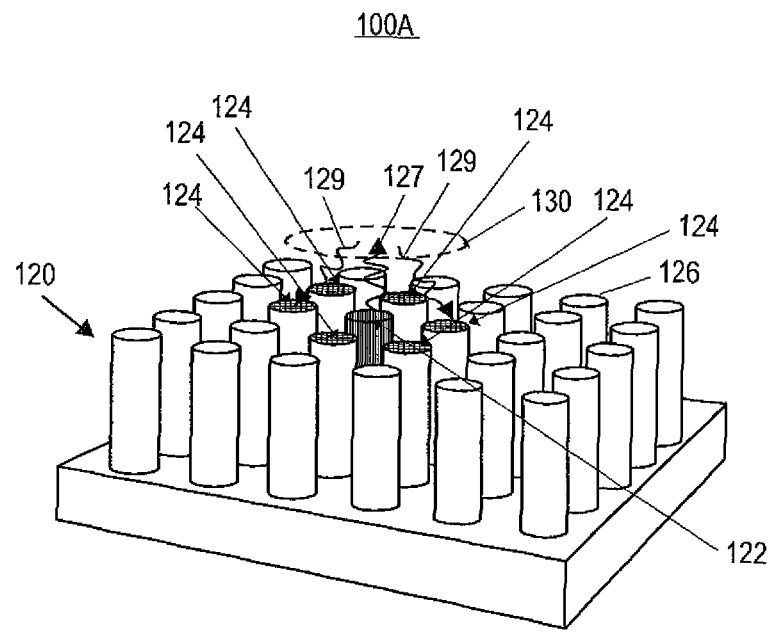
FIG. 1A is a schematic for an exemplary light emitter array and its operation for the solid-state microscope (SSM) in accordance with the present teachings.

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration, specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Exemplary embodiments provide solid-state microscope (SSM) devices and methods for processing and using the SSM devices. The solid-state microscope devices can include a light emitter array having a plurality of light emitters with each light emitter individually addressable. During operation, each light emitter can be biased in one of three operating states including an emit state, a detect state, and an off state. The light emitter can include an LED (light emitting diode) including, but not limited to, a nanowire based LED or a planar LED to provide various desired image resolutions for the SSM devices. In an exemplary embodiment, for near-field microscopy, the resolution of the SSM microscope can be approximately defined by the pitch p, i.e., center-to-center spacing between two adjacent light emitters, of the light emitter array.

In various embodiments, the disclosed SSM devices can be lightweight and small in size. For example, a SSM device can have a weight and size both less than 1/1000 of the weight and size of a conventional optical microscope. In addition, the disclosed SSM devices can be highly portable and robust with desired image resolutions. In one embodiment, the disclosed SSM devices can include a plurality of nano-photonic light emitting devices, such as nanowire-based LEDs, having an image resolution of about 1 micron or greater. In one embodiment, the image resolution can be about 1 micron to about 10 microns. In another embodiment, the disclosed SSM devices can include a planar LED array having an image resolution of about 10 microns to about 50 microns or greater. Note that the above resolution values are "raw" values that do not include improvements gained by subsequent digital processing that is known to one of ordinary skill in the related art. In various embodiments, the subsequent digital processing of the data from these SSM devices can take place in a connected computer control system to further improve the above resolution values.

FIG. 1A is a schematic of an exemplary SSM light emitter array 100A in accordance with the present teachings. It should be readily apparent to one of ordinary skill in the art that the array 100A depicted in FIG. 1A represents a generalized schematic illustration and that other layers/light emitters can be added or existing layers/light emitters can be removed or modified.

As shown, the exemplary SSM light emitter array 100A can include a plurality of light emitters 120 formed over a substrate 110. A sample object 130 placed over the light emitter array 100A can thus be viewed/examined.

The substrate 110 can be, e.g., any substrate on which a group III-N material or other light-emitting semiconductor, can be grown. In various embodiments, the substrate 110 can include, but is not limited to, a sapphire, silicon carbide, silicon, silicon-on-insulator (SOI), III-V semiconductor compounds such as GaN or GaAs, metal, ceramic or glass.

The plurality of light emitters 120 can include, for example, a nanowire-based LED, a planar LED or any other suitable light emitters depending on the microscopic applications. In various embodiments, each light emitter can be biased in one of three operating states including an emit state, a detect state, and an off state, in order to operate the SSM array 100A. For example, as shown in FIG. 1A, the plurality of light emitters 120 can further include three sets of light emitters including a first set of the light emitters 122 that are surrounded by a second set of light emitters 124, and a third set of light emitters 126. In various embodiments, each set of light emitters can include one or more light emitters.

The SSM array 100A can build a digital image using a reflection mechanism or a transmission mechanism. In embodiments for reflection based operations, the first set of light emitters 122 can be "on" emitters that can illuminate a small area of the sample object 130. For example, the small area can have an area on an order of $\mu m^2$. The emitted light 127 from the "on" light emitters 122 can then be reflected, scattered and/or diffracted from the sample object 130 and the returned light, e.g., the reflected light 129, can then be collected immediately by the surrounding set of light emitters 124, which are electrically reverse biased to function as photo-detectors. In an exemplary embodiment, the first set of emitters 122 can be forward biased so that they emit light. The second set of emitters 124 can be reversely biased so that they detect light. The third set of light emitters 126, i.e., the remaining light emitters in the plurality of light emitters 120, can be unbiased, e.g., switched off during this step.

The SSM array 100A can correspond to the image resolution that is defined by the size of the illuminated light spot on the sample object 130. The size of the illuminated spot (not illustrated) can correspond approximately to the pitch p of the light emitter array 120 and also depend on how much diffraction, reflection, and/or absorption occur in the sample object 130. As shown, the plurality of light emitters 120 can possess a controllable pitch p and thus to control the resulting image resolution. In some embodiments, the light emitter array can be in a high density having a pitch p, e.g., of about 1 micron to 10 microns for an image resolution of about 10 microns or less. In other embodiments, the pitch p can be, for example, in a range of about 10 microns to about 50 microns, or greater, according to an image resolution requirement.

In an exemplary embodiment for the reflection type mechanism, several "rings" of light emitters 124 can surround one light emitter 122 and can be biased as detectors to detect the reflected light 129 from the illuminated spot on the sample object 130.

In another exemplary embodiment for operations that involve transmitted mechanism, a conventional photodetector (not shown in FIG. 1A) can be placed above the sample object 130. Such photodetector can have large area for detecting the transmitted light through an optically clear sample object 130. For example, one light emitter 122 can be biased as an "on" emitter that can illuminate a small area of the sample object 130. The emitted light 127 from the "on" light emitter 122 can be transmitted through the sample object 130 and the transmitted light (not illustrated in FIG. 1A) can then be collected immediately by the photodetector placed thereabove.

In a third exemplary embodiment, a detector array having a detector pitch that is identical to the pitch of the LED emitter array, can be placed above the emitter array. The spacing between the underlying emitter array and the overlying detector array can be adjusted and used to define a narrow channel. The height of this channel can further be adjusted to provide a degree of filtering of a specimen, allowing only objects with a size smaller than the channel height to enter the viewing area. The resolution of this arrayed emitter plus arrayed detector arrangement can be expected to be superior to that of the two previous single emitter array embodiments described above and can be used, for example, to create pseudo-3D microscope images.

Figure 1B:
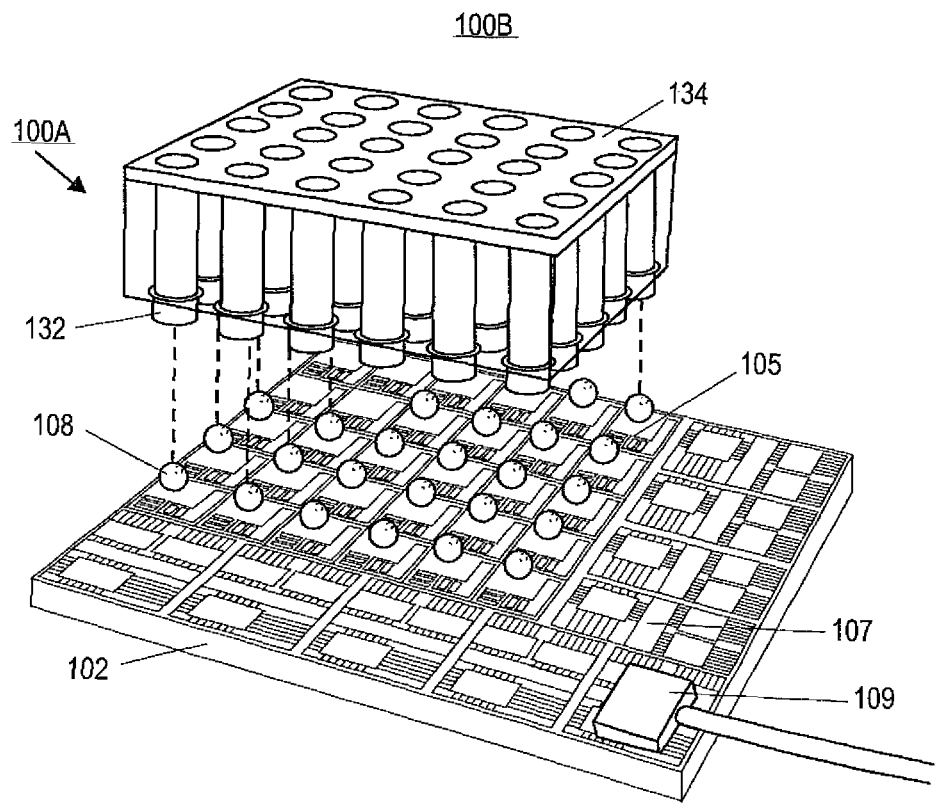
FIG. 1B is a schematic for an exemplary SSM device in accordance with the present teachings.

FIG. 1B is a schematic for an exemplary SSM device 100B in accordance with the present teachings. It should be readily apparent to one of ordinary skill in the art that the device 100B depicted in FIG. 1B represents a generalized schematic illustration and that other layers/light emitters/circuit cells can be added or existing layers/light emitters/circuit cells can be removed or modified.

As shown, the device 100B can include the SSM light emitter array 100A connected with a CMOS integrated circuit 102 through a plurality of bump bond 108. The CMOS integrated circuit 102 can further include a plurality of read out integrated circuit (ROIC) cells 105 and peripheral circuits 107. The light emitter array 100A can further include a plurality of electrical contacts 132 and 134 used as p-electrodes and n-electrodes for the light emitters in the array 100A. For example, each light emitter in the array 100A can be connected to a corresponding ROIC cell 105 through one bump bond 108. The plurality of ROIC cells 105 can thus be configured having the same pitch p as that for the light emitter array 100A in FIG. 1A.

The bump bonds (108) and the electrical contacts (132 or 134) can include conductive structures formed from metals such as indium (In), titanium (Ti), aluminum (Al), platinum (Pt), nickel (Ni) or gold (Au), for example, in a number of multi-layered combinations such as Al/Ti/Pt/Au, Ni/Au, Ti/Al, Ti/Au, Ti/Al/Ti/Au, Ti/Al/Au, Al or Au using techniques known to one of ordinary skill in the art.

In various embodiments, the disclosed SSM configuration can build a magnified pixel-by-pixel digital image of the sample object. Specifically, the action of switching on one (or more) light emitter (e.g., the light emitter 122) in the plurality of light emitters, detecting and storing the intensity of the reflected or transmitted light from the sample object, can create one pixel in the digital image. For example, the photocurrent of the light detectors (e.g., the light emitters 124 in FIG. 1A) in the light emitter array 100A can be summed by, for example, related ROIC cells 105 and transferred at 109 to a control computer (not shown) to fix the intensity of the first pixel. Following the creation of the first pixel in the digital image, the light emitter 122 can then be switched off, one of its neighbor light emitters can be switched on, and the operation procedure can be repeated to build up a second pixel in the digital image. This process can subsequently be repeated across the area of the plurality of light emitters 120 to build the full digital image of the sample object 130. In various embodiments, for objects close to the array surface, the image resolution can be similar to the pitch p between the individual light emitters.

The peripheral circuits 107 can be used for multiplexing and transferring data from the ROIC cells 105 to the control computer (not shown). For example, after the image has been collected by some of the light emitters (e.g., 124) in the array 100A, various image data manipulation algorithms can be applied to the resulting digital images. Patterns within the image, the image contrast or other image parameters, can be recognized and/or controlled. Unlike conventional optical microscope (COM), SSM algorithms can further process the image data in a real-time feedback loop, which can manipulate the switching sequence or switching speed of the individual light emitter or LED to optimize image resolution, enhance specific regions of the image, etc. The image resolution can also be improved through advanced digital-imaging processes that are known to one skilled in the art.

The light emitter array 100A and the SSM device 100B can provide many advantages as compared with the conventional optical microscope (COM). For example, the SSM devices can have a light weight and small size, such as less than $1/1000$ of the weight and size of a COM. Additionally, the SSM devices can omit moving parts from the microscope, which makes the disclosed devices robust and highly portable. Further, due to the sequential switching of light emitters, the SSM devices can provide an average illumination power onto the sample object, which is particularly advantageous for examining biological samples (e.g., living cells) that may be irreversibly degraded by over-illumination.

Furthermore, the light emitters, such as the LEDs, used for the SSM devices can be constructed to emit light with a specific wavelength, e.g., chosen to excite a specific mechanism or process in the sample object. For example, various fluorescent dyes or other fluorophores can be used to "stain" specific parts of living cells. The disclosed SSM array 100A can emit a specific wavelength to excite a specific fluorescence in these certain fluorophores. In various embodiments, each light emitter used in the SSM devices can be an individually addressable light emitter to provide a specific emission wavelength. With the use of advanced fluorophores, such as NQDs (nanoscale quantum dots) that can be excited by a wide range of wavelengths yet emit only over a narrow wavelength band, various different fluorescences in one sample object can be examined by a single SSM device.

Referring back to FIGS. 1A-1B, various light emitters 120, e.g., nanowire-based core-shell LEDs and/or planar LEDs, can be used for the light emitter array 100A and the device 100B. In various embodiments, each light emitter or LED can be formed using a III-V compound semiconductor materials system, for example, the group III-N compound materials system. In an exemplary embodiment, a layered multi-quantum-well (MQW) structure can be used in a form of, for example, a core-shell structure or a planar structure. For example, the layered MQW structure of the LEDs can include a MQW active region disposed between a first doped layer and a second doped layer. In various embodiments, a third doped layer can be disposed on the second doped layer.

The MQW active region can include, for example, group III-N quantum wells, such as InGaN/GaN quantum wells, AlGaN/GaN quantum wells or other III-N quantum wells.

For example, the MQW active region can include alternating layers of $Al_xGa_{1-x}N$ and GaN, or $In_xGa_{1-x}N$ and GaN, where x can be any number less than or equal to 1.00. The MQW active region can be disposed between the first doped layer, e.g., n-doped GaN, or n-doped $Al_xGa_{1-x}N$, and the second doped layer, e.g., p-doped $Al_xGa_{1-x}N$. The third doped layer can be formed of, for example, p-doped GaN.

In various embodiments, various dopants can be used for the layered MQW structure for a desired conductivity. For example, if the first doped layer is an n-type, the second doped layer and/or the third doped layer can be a p-type and vice versa. The dopant used can be, for example, a p-type dopant chosen from Group II of the periodic table (e.g. Mg, Zn, Cd or Hg); a p-type dopant chosen from Group IV of the periodic table, (e.g., C); or an n-type dopant chosen from a group consisting of: Si, Ge, Sn, S, Se and Te.

In various embodiments, the SSM devices can be formed by various crystal growth techniques including, but not limited to, metal-organic chemical vapor deposition (MOCVD) (also known as organometallic vapor phase epitaxy (OM-VPE)), pulsed MOCVD, molecular-beam epitaxy (MBE), gas source MBE (GSMBE), metal-organic MBE (MOMBE), atomic layer epitaxy (ALE), or hydride vapor phase epitaxy (HVPE).

In various embodiments, dielectric materials can be involved in formation of the disclosed SSM device including the layered MQW structure, or nanowires. For example, dielectric materials can be used for electrical isolation between the nanowire core-shell LEDs and/or planar LEDs, and for electrical isolation between the p-side and n-side of individual LEDs. As used herein, the dielectric materials can include, but are not limited to, silicon dioxide ($SiO_2$), silicon nitride ($Si_3N_4$), silicon oxynitride (SiON), fluorinated silicon dioxide (SiOF), silicon oxycarbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($ZrSiO_2$), tantalum oxide ($TaO_2$) or other insulating materials.

Figure 2:
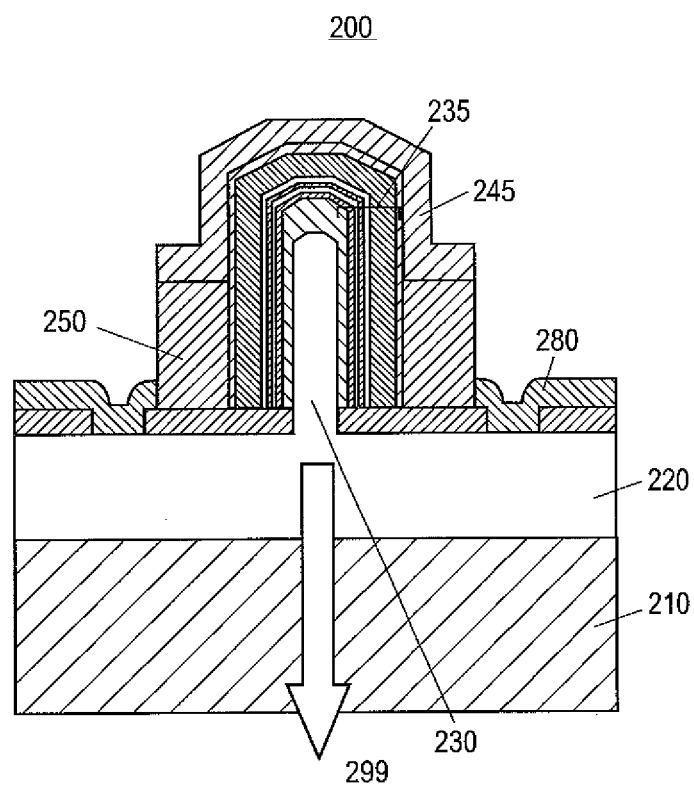
FIG. 2 depicts an exemplary nanowire-based LED (light emitting diode) used for the light emitter array of FIGS. 1A-1B in accordance with the present teachings.

FIG. 2 depicts an exemplary light emitter 200 that includes a nanowire core-shell structure in accordance with the present teachings. In various embodiments, the exemplary light emitter 200 can be the nanowire devices as described in the related U.S. patent application Ser. No. 11/684,264, entitled "Pulsed Growth of Catalyst-Free Growth of GaN Nanowires and Application in Group III Nitride Semiconductor Bulk Material," which is hereby incorporated by reference in its entirety.

For example, the device 200 can include a layered MQW structure 235 having a "shell" structure formed on the sidewalls of a nanowire core 230. The MQW core-shell structure can be formed over a buffer layer 220 over a substrate 210. It should be readily apparent to one of ordinary skill in the art that the device 200 depicted in FIG. 2 represents a generalized schematic illustration and that other nanowires/layers/shells can be added or existing nanowires/layers/shells can be removed or modified.

As shown, the substrate 210 can be a substrate including, but not limited to, sapphire, silicon carbide, silicon and III-V substrates such as GaAs, or GaN. The doped buffer layer 220 can be formed over the substrate 210. The doped buffer layer 220 can be formed of, for example, GaN, AlN, InN, AlGaN, InGaN or AlInGaN, by various crystal growth methods known to one of ordinary skill in the art. In various embodiments, the doped buffer layer 220 can be doped with a conductivity type similar to the doped nanowire core 230. In some embodiments, the doped buffer layer 220 can be removed from the device 200.

The nanowire 230 can have an elongated conductive or semiconductive material that includes at least one minor dimension, for example, one of the cross-sectional dimensions such as width or diameter, of less than or equal to about 1000 nm. The nanowires can have an aspect ratio (e.g., length:width and/or major dimension:minor dimension) of about 1 or greater. The nanowires can have various cross-sectional shapes, such as, for example, a rectangular, polygonal, square, oval, or circular shape. The doped nanowire 230 can be formed of, for example, GaN, AlN, InN, AlGaN, InGaN or AlInGaN, which can be made an n-type by doping with various impurities such as silicon, germanium, selenium, sulfur and tellurium or a p-type by introducing beryllium, strontium, barium, zinc, or magnesium.

It is also intended that the term "nanowires" encompasses other elongated structures of like dimensions including, but not limited to, nanoshafts, nanopillars, nanoneedles, nanorods, and nanotubes (e.g., single wall nanotubes, or multiwall nanotubes), and their various functionalized and derivatized fibril forms, such as nanofibers in the form of thread, yarn, fabrics, etc.

In various embodiments, the p-electrodes 245 can be electrically isolated from each other by a dielectric material 250, when a number of nanowires 230 and the p-electrodes 245 are included in a large area such as a wafer. It is anticipated that one of the electrodes, for example, the n-electrode 280, can be common to, and connect, all LEDs within an array. As shown in FIG. 2, conductive structures 245 or a p-electrode can be formed on each surface of the layered MQW structure 235 and the dielectric material 250. In addition, n-electrodes 280 can be formed to assure the conduction between the n-side contact and the central conductive region including the doped buffer layer 220 and the nanowire core 230.

At 299 in FIG. 2, the emitting light of the nanowire-based LED 200 in FIG. 2 can be extracted through the substrate 220, which can be transparent at the emitted light wavelengths. Alternatively, a light output can occur on the top side of the device 200 (not shown) since the nanowire-based LED device 200 can be small enough for sufficient diffraction. While this diffuse light output can be advantageous in solid-state lighting applications the light can be made collimated by a thicker metal electrode (not shown) that would form a collimation tube.

Although a single nanowire is depicted in FIG. 2 for the purpose of description, one of ordinary skill in the art will understand that a number of nanowires can be formed simultaneously with a high density in a large area (e.g., a whole wafer).

Figure 3:
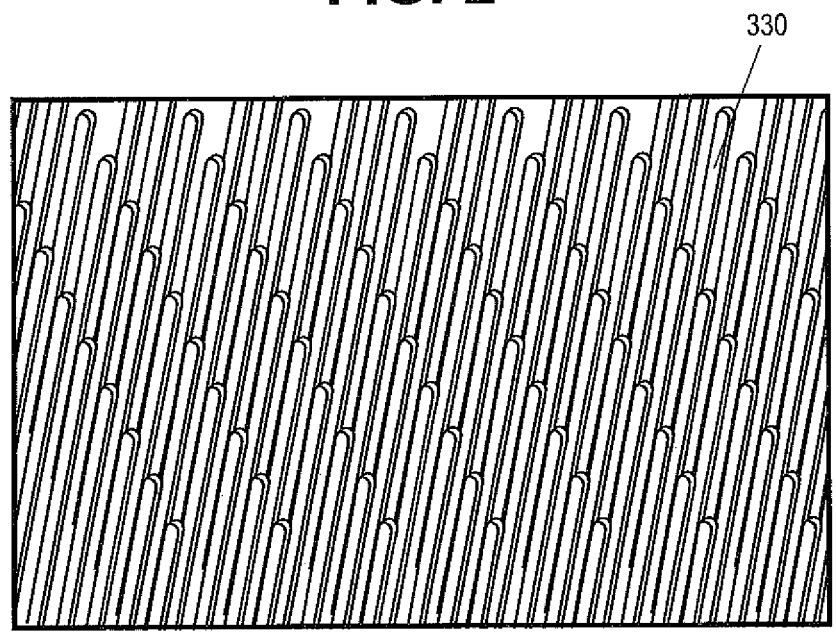
FIG. 3 is a schematic for an exemplary III-N nanowire array in accordance with the present teachings.

FIG. 3 is a schematic for an exemplary III-N nanowire array in accordance with the present teachings. The exemplary GaN nanowire 330 can have high quality (e.g. essentially free from threading defects) and large scale uniformity of position, crystallographic orientation, length, cross-sectional features (e.g., the dimensions and/or shapes). For example, the GaN nanowire 330 can have single crystal GaN with a diameter ranging from about 200 nm to about 300 nm. In addition, the nanowire sidewall facets can be of the nonpolar family, which creates an opportunity for eliminating the quantum confined Stark effect (QCSE) from LEDs by using a radial LED geometry.

Figure 4:
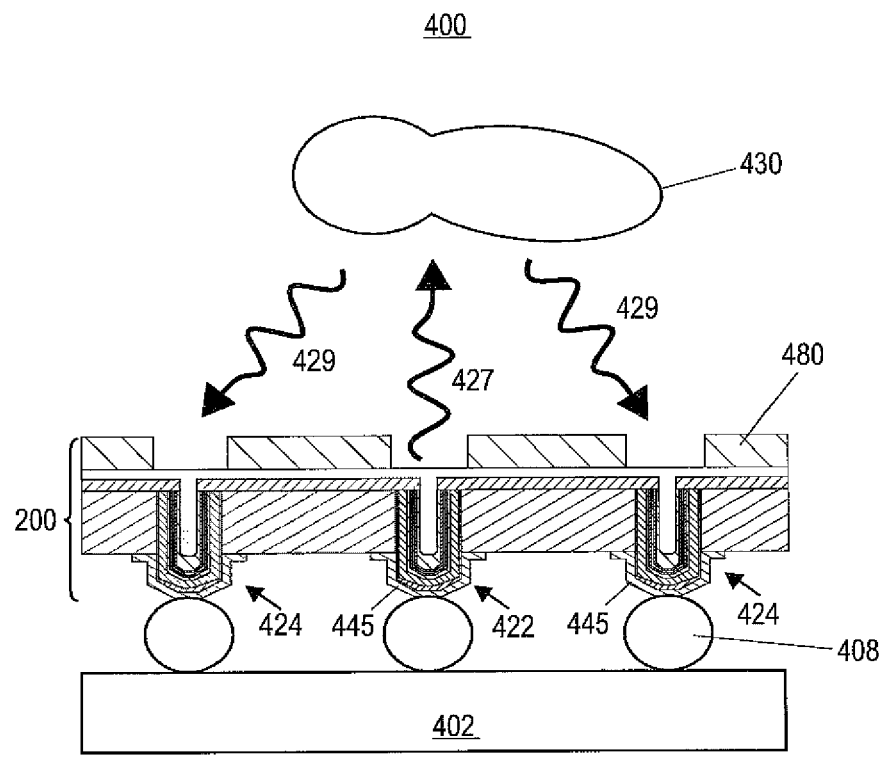
FIG. 4 depicts an exemplary SSM device having nanowire-based LED array in accordance with the present teachings.

FIG. 4 depicts an exemplary SSM device 400 and its operation using the nanowire LEDs shown in FIG. 2 in accordance with the present teachings. It should be readily apparent to one of ordinary skill in the art that the device 400 depicted in FIG. 4 represents a generalized schematic illustration and that other nanowires/LEDs can be added or existing nanowires/LEDs can be removed or modified.

As shown in FIG. 4, the SSM device 400 can include, for example, an LED array having a plurality of nanowire LEDs 200 as described in FIG. 2. The plurality of nanowire LEDs 200 can include an exemplary "on" light emitter 422 and two LED light detectors 424 as examples. Each nanowire LED can include a p-electrode 445 and an n-electrode 480. An ROIC circuit board 402 can be connected to the plurality of nanowire LEDs 200 through, for example, a plurality of bump-bonded p-contacts 408.

During the exemplary reflection type operation, the LED 422 can be an "on" emitter to illuminate a small area of the sample object 430. The emitted light 427 from the "on" light emitters 422 can then be reflected, scattered and/or diffracted from the sample object 430 and the returned light or reflected light 429 can then be collected immediately by the surrounding LED light detectors 424 as illustrated.

The photocurrent from the light detectors 424 can be summed by the ROIC circuit 402 and transferred to a control computer (not shown) fixing the intensity of an image pixel. By repeating such process, a pixel-to-pixel magnified image of the sample object 430 can then be built. In various embodiments, the device configuration, the ROIC circuit board, the operation process, along with the data process shown in FIG. 4 can be similar to that described in FIGS. 1A-1B.

In various embodiments, the SSM light emitter array in FIGS. 1A-1B and FIG. 4 can include a planar LED in accordance with the present teachings. The planar LED light emitter array can be fabricated using a "top-down" fabrication process as illustrated in FIGS. 5A-5D in accordance with the present teachings. Specifically, FIGS. 5A-5D depict another exemplary light emitter array 500 at various stages of fabrication in accordance with the present teachings. The planar LED array can include any III-V based LEDs such as GaN-based LEDs.

While the disclosed exemplary fabrication process is illustrated and described below as a series of acts or events, it will be appreciated that the present invention may not limited by the illustrated ordering of such acts or events. For example, some acts may occur in different orders and/or concurrently with other acts or events apart from those illustrated and/or described herein, in accordance with the present teachings. In addition, not all illustrated steps may be required to implement a methodology in accordance with the present teachings.

Figure 5A:
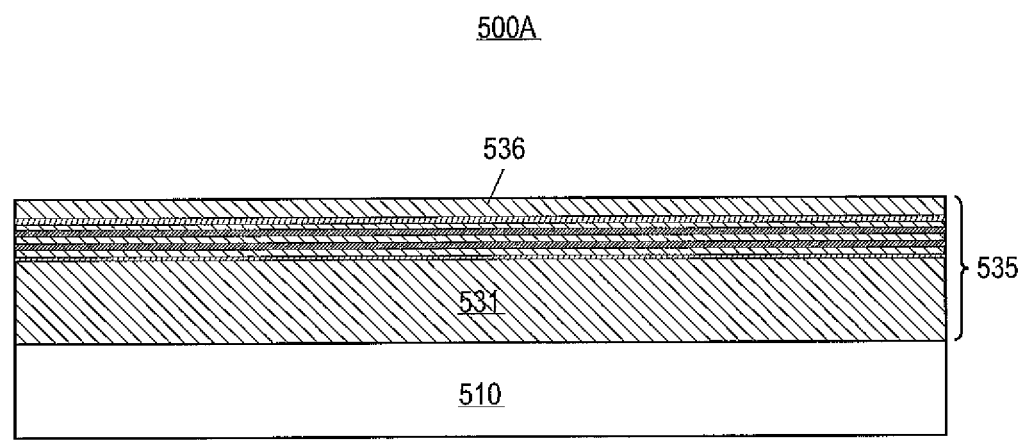
FIGS. 5A-5D depicts another exemplary planar LED light emitter array at various stages of fabrication used for the SSM device in FIG. 1B in accordance with the present teachings.

In FIG. 5A, an exemplary MQW epitaxial layered LED structure 500A can be formed using methods known to one of ordinary skill in the art. For example, the MQW LED structure 500A can include a substrate 510 and a layered MQW structure 535. In various embodiments, the dopants and the materials used for each layer of the LED structure 500A can be similar as those described above for FIG. 2 and FIG. 4. In an exemplary embodiment, the layered MQW structure 535 can include an InGaN based MQW active region disposed between an n-doped GaN layer 531 and a p-doped AlGaN layer. P-doped GaN layer 536 can be formed over the p-doped AlGaN layer over the InGaN based MQW active region. The n-doped GaN layer 531 can be formed on the substrate 510.

Figure 5B:
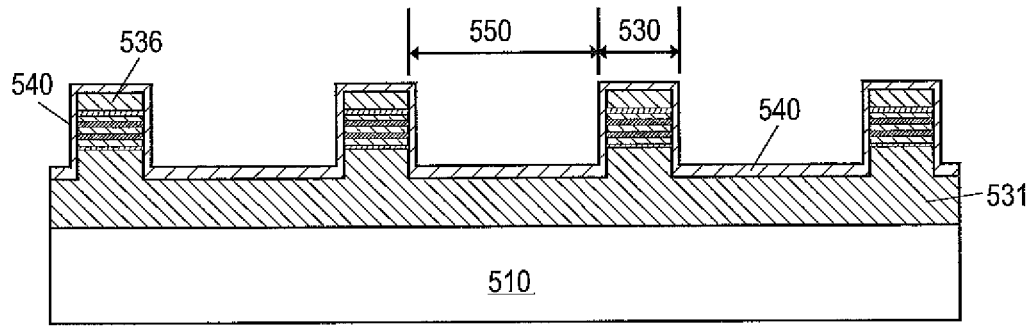

In FIG. 5B, a plurality of LED mesas 530 can then be defined by etching the structure 500A to the n-doped GaN layer 531 and having recessed spaces 550 between any two adjacent LED mesas. In various embodiments, during this etching, the etching damage can be minimized and thereby providing a small diameter, for example, about 5 microns or less, of each LED and rendering the proximity of the LED active region an etched-mesa sidewall-surface. Several suitable strategies can be used for minimizing such damage. For example, an RIE (reactive ion etch) etching process can be first conducted and followed by a passivation process to the RIE damage. This is because the RIE process can damage the surface and subsurface of the mesa sidewalls, although the RIE process can provide a shape control to the LED mesas. The passivation process can then be performed by either a wet-etch treatment, a surface passivation layer 540, or by both of these. The surface passivation layer 540, for example, a dielectric layer including such as silicon nitride, can be formed on the entire surface of the etched structure 500A including the LED mesas and the recessed spaces between the LED mesas. In various embodiments, the etching process can include, for example, standard ICP (i.e., inductively coupled plasma) mesa etch techniques known to one of ordinary skill in the art.

In various embodiments, the dimensions of the LED mesas 530 and the recessed spaces 550 can determine the pitch p of the SSM array (e.g., configured similarly as in FIGS. 1A-1B and FIG. 4) and thus determine the resulting image resolution. For example, if an LED array is designed to have a pitch p of about 20 microns, the LED mesa diameter/width can be etched to be about 5 microns leaving a recessed space 550 of about 15 microns wide between adjacent mesas 530. In various embodiments, the recessed space can provide a sufficient space to subsequently run, e.g., the n-side contact metal contacts out to the edges of the SSM device/chip.

Figure 5C:
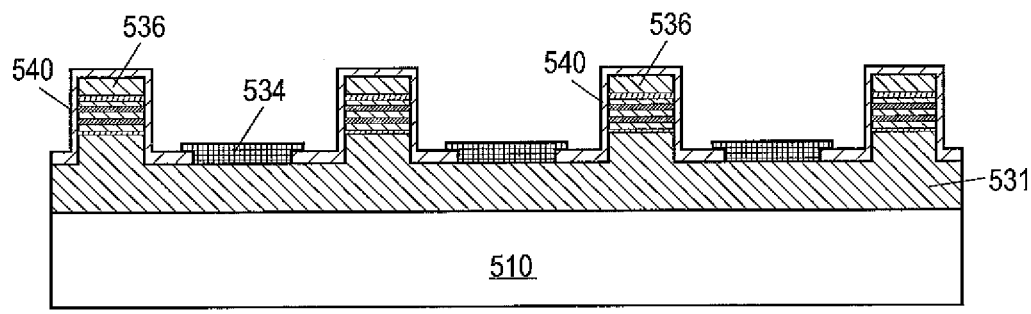

In FIG. 5C, the passivation layer 540 within the recessed spaces 550 can then be patterned by photolithography and etched to allow deposition and definition of a plurality of n-side metal contacts 534. These lower n-side contacts 534 can thus be connected to a first doped layer 531, e.g., an n$^+$ GaN layer, of the layered MQW structure 535 and can run as stripes that are perpendicular to the plane of the FIG. 5C page.

Figure 5D:
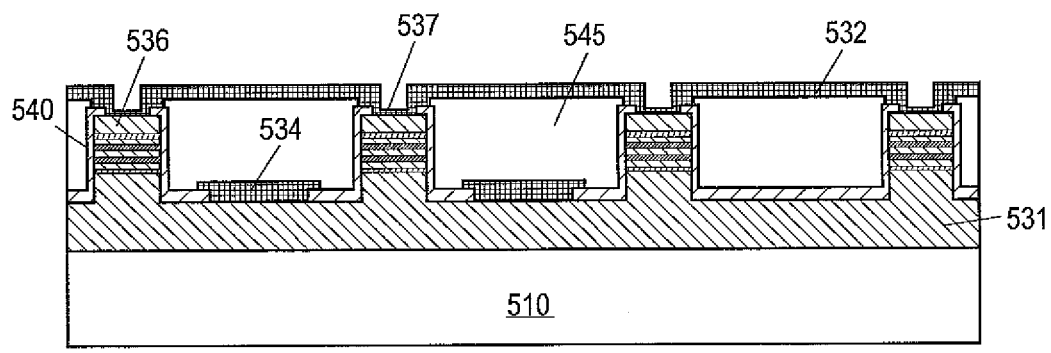

In FIG. 5D, the n-contacts 534 can be buried, for example, under a spin-on, curable and etchable dielectric material 545 that completely fills the recessed space 550 between the mesas 530 (also see FIG. 5B-5C). The passivation layer 540 and spin-on-dielectric 545 can then be patterned by photolithography and etched to allow deposition and definition of the p-side metal contact stripes 532. The lithographically defined p-electrode recess 537 in the p-side metal 532 can keep the metal transparent over the central part of each LED mesa to allow light emission. The p-side metal contact 532 can be in the form of stripes and can run in a direction parallel to the plane of the figure page, e.g., in a direction of left-to-right. This can create an X-Y contact array where each stripe can be accessible at the edge of the SSM "chip" and all LEDs in the array can be individually addressable.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A solid-state microscope for imaging an object comprising:
   a semiconductor substrate;
   a first light emitter disposed on the semiconductor substrate, were the first light emitter is biased in an emit operating state at a first time period and biased in a detect state at a second time period, the second time period being subsequent to the first time period;
   a second light emitter disposed on the substrate and adjacent to the first light emitter, wherein the second light emitter is biased in a detect operating state at the first time period and biased in the emit state during a second time period; and a plurality of light emitters disposed on the semiconductor substrate, wherein the first light emitter, the second light emitter, and the plurality of light emitters are disposed in an array having a pitch p, wherein the first light emitter, the second lighter emitter, and each light emitter of the plurality of light emitters is operable to be biased in one of an emit operating state, a detect operating state, and an off operating state, and wherein each light emitter of the plurality of light emitters is in a lens-less arrangement with the object.

2. The solid-state microscope of claim 1, further comprising a read out integrated circuit (ROIC) cell connected to each light emitter of the plurality of light emitters.

3. The solid-state microscope of claim 1, wherein the pitch p of the array is about 1 micron or greater.

4. The solid-state microscope of claim 1, wherein the substrate comprises one or more materials selected from the group consisting of Si, SiC, sapphire, GaN and GaAs.

5. The solid-state microscope of claim 1, wherein the plurality of light emitters disposed in an array comprises:
   one or more light emitters biased in the emit operating state to illuminate an object portion;
   a first plurality of light emitters that surround the one light emitter and biased in the detect operating state to detect a reflected light from the illuminated object portion; and
   a second plurality of light emitters biased in the off operating state.

6. The solid-state microscope of claim 1, wherein each light emitter emits light at a wavelength to excite a specific mechanism in the object.

7. The solid-state microscope of claim 1, wherein each light emitter comprises a multi-quantum-well (MQW) active region comprising one or more materials chosen from InGaN, AlGaN, or GaN.

8. The solid-state microscope of claim 1, wherein the pitch p ranges from about 1 micron to about 3 microns for a nanowire based LED (light emitting diode) array.

9. The solid-state microscope of claim 8, wherein the nanowire based LED array comprises a core-shell LED comprising a MQW shell and a nanowire core, wherein the nanowire core comprises one or more materials chosen from GaN, AlN, InN, InGaN, AlInGaN, AlGaN, InP, or GaAs.

10. The solid-state microscope of claim 9, wherein the nanowire core is formed using a pulsed metal-organic chemical vapor deposition growth mode.

11. The solid-state microscope of claim 1, wherein the pitch p is about 10 microns or greater for a planar LED array.

12. The solid-state microscope of claim 11, wherein each planar LED of the planar LED array comprises an InGaN based multi-quantum-well active region disposed between an n-doped GaN layer and a p-doped AlGaN or GaN layer.

13. The solid-state microscope of claim 1, further comprising a photocollector, wherein the object is disposed between the photocollector and the plurality of light emitters for a transmission mechanism.

14. The solid-state microscope of claim 1, further comprising a second solid-state microscope placed above the object and allowing simultaneous viewing of the same object from two sides.

* * * * *